(12) United States Patent
Liu et al.

(10) Patent No.: US 8,974,893 B2
(45) Date of Patent: Mar. 10, 2015

(54) ARTIFICIAL MICROSTRUCTURE AND ARTIFICIAL ELECTROMAGNETIC MATERIAL USING THE SAME

(75) Inventors: Ruopeng Liu, Shenzhen (CN); Lin Luan, Shenzhen (CN); Chaofeng Kou, Shenzhen (CN); Jincai Ye, Shenzhen (CN)

(73) Assignees: Kuang-Chi Innovative Technology Ltd., Shenzhen (CN); Kuang-Chi Institute of Advanced Technology, Shenzhen (CN)

( * ) Notice: Subject to any disclaimer, the term of this patent is extended or adjusted under 35 U.S.C. 154(b) by 0 days.

(21) Appl. No.: 13/634,826

(22) PCT Filed: Oct. 27, 2011

(86) PCT No.: PCT/CN2011/081441
§ 371 (c)(1),
(2), (4) Date: Sep. 13, 2012

(87) PCT Pub. No.: WO2012/171295
PCT Pub. Date: Dec. 20, 2012

(65) Prior Publication Data
US 2013/0164508 A1    Jun. 27, 2013

(51) Int. Cl.
*B81B 7/00*    (2006.01)
*H01Q 15/00*    (2006.01)

(52) U.S. Cl.
CPC ............. *B81B 7/00* (2013.01); *H01Q 15/0086* (2013.01)
USPC .......................... 428/195.1; 428/201; 428/209

(58) Field of Classification Search
USPC ..................................... 428/195.1
See application file for complete search history.

(56) References Cited

U.S. PATENT DOCUMENTS

| 7,570,432 | B1 | 8/2009 | Yonak | |
|---|---|---|---|---|
| 2004/0151876 | A1* | 8/2004 | Tanielian | 428/137 |
| 2006/0022875 | A1 | 2/2006 | Pidwerbetsky et al. | |
| 2010/0141358 | A1* | 6/2010 | Akyurtlu et al. | 333/219.1 |
| 2010/0156573 | A1* | 6/2010 | Smith et al. | 333/239 |
| 2010/0314040 | A1 | 12/2010 | Tyler, II et al. | |

FOREIGN PATENT DOCUMENTS

CN    101587990 A    11/2009
WO    2008045536 A    4/2008

OTHER PUBLICATIONS

"A dual band terahertz metamaterial absorber", by Hu Tao et al., <<Journal of Physics D: Applied Physics>> Institute of Physics Publishing Ltd., GB, vol. 43, No. 22, Jun. 9, 2010, p. 225102, XP020171158, pp. 1-3, and Figs. 1-2.
"Transmission and reflection properties of composite double negative metamaterials in free space", by Aydin K et al., <<IEEE Transactions on Antennas and Propagation, vol. 51, No. 10>>, Published on Oct. 1, 2003, pp. 2592-2595, ISSN: 0018-906X, DOI: 10.1109/TAP. 2003.817570.

\* cited by examiner

*Primary Examiner* — Mark Ruthkosky
*Assistant Examiner* — Ian Rummel
(74) *Attorney, Agent, or Firm* — Leason Ellis LLP.

(57) ABSTRACT

An artificial microstructure comprises two "I" shaped metal wire structures. The two "I" shaped metal wire structures are separated to each other. The present invention also discloses an artificial electromagnetic material using the artificial microstructures. The artificial electromagnetic material has high resonance frequency, wide effective frequency band and has a wide application range.

21 Claims, 13 Drawing Sheets

ARTIFICIAL MICROSTRUCTURE AND ARTIFICIAL ELECTROMAGNETIC MATERIAL USING THE SAME

CROSS-REFERENCE TO RELATED PATENT APPLICATIONS

This is a U.S. National Phase Application under 35 U.S.C. §371 of International Patent Application No. PCT/CN2011/081441, filed Oct. 27, 2011, and claims the priority of Chinese Patent Application Nos. CN201110179890.3 filed Jun. 29, 2012 and CN 201110163799.2 filed Jun. 17, 2011, all of which are incorporated by reference herein.

FIELD OF THE INVENTION

The exemplary invention relates to material, and particularly, to an artificial microstructure and an artificial electromagnetic material using the same.

BACKGROUND OF THE INVENTION

Metamaterial also known as artificial electromagnetic material is a new academic vocabulary in the field of physics in the 21st century and is usually issued on different kinds of scientific literatures. The metamaterial includes three important characteristics: (1) the metamaterial is a composite material usually with novel artificial structure; (2) the metamaterial usually has extraordinary physical characteristic, which does not exist in the nature materials; (3) the characteristics of the metamaterial are not determiend by the inherent characteristic of the constituent materials, but mainly dependent on the artificial structures.

That is to say, the metamaterial is a material that is composed of a plurality of artificial microstructures which are used as basic units and are placed in a specific spatial arrangement. Moreover, the metamaterial is a new material with specific electromagnetic response, and the characteristics of the electromagnetic response are dependent on the characteristics of the artificial microstructures. By orderly designing of the structure on crucial physical size of the material, some limitations of the nature law can be overcome, therefore obtaining the metamaterial characteristic that is beyond the inherent ordinary characteristic in the nature.

The metamaterial includes a plurality of artificial microstructures, and the electromagnetic responses of the artificial microstructures mainly depend on the topological characteristics and the size of the structural units of the artificial microstructures.

The metamaterial further includes a substrate attached by the artificial microstructures. The substrate is a structure that serves to support the arranged artificial microstructures, and can be made of any nonmetal material different from that of the artificial microstructures.

The artificial microstructures and the substrate are superimposed together to generate an equivalent dielectric constant $\xi$ and an equivalent permeability $\mu$ in the space, both of which respectively correspond to the electric field response and the magnetic field response of the material. Thus, the design of the artificial microstructures of the metamaterial is most crucial part in the field of metamaterials. Therefore, it is becoming a major problem in the development of modem technology that how to obtain a metamaterial, and further improve the electromagnetic characteristic of the existing electromagnetic materials, and replace the existing electromagnetic materials to achieve in practice.

DISCLOSURE OF THE INVENTION

The present invention provides an artificial microstructure which includes two "I" shaped metal wire structures, wherein the two "I" shaped metal wire structures are separated to each other.

The two "I" shaped metal wire structures have the different sizes.

The two "I" shaped metal wire structures of each artificial microstructure are placed in parallel arrangement, the two pairs of parallel lines of the two "I" shaped metal wire structures are parallel to each other, and the two vertical lines of the two "I" shaped metal wire structures are parallel to each other.

The vertical lines of the two "I" shaped metal wire structures are in the same line, that makes the two "I" shaped metal wire structures to be preferably positioned up and down.

The vertical lines of the two "I" shaped metal wire structures are connected to two opening rings, and the opening of one opening ring faces towards that of the other opening ring.

The two "I" shaped metal wire structures have the same size, and the opening rings of the two "I" shaped metal wire structures have the same size.

The two "I" shaped metal wire structures are different in size, and the opening rings of the two "I" shaped metal wire structures are different in size.

Each of the opening rings is a rectangular opening structure.

The artificial microstructures are made by copper wires.

The artificial microstructures are made by silver wires.

The cross-section of the metal wire is any of a rectangle, circle and flat shape.

The size of each artificial microstructure is less than one tenth of the wave length of the incident electromagnetic wave.

The present invention further provides an artificial electromagnetic material. The artificial electromagnetic material includes a substrate and a plurality of artificial microstructures, wherein the plurality of artificial microstructures are attached on the substrate.

The artificial microstructures are placed on the substrate in an array arrangement.

The substrate is divided into a plurality of identical cuboid substrate units close to each other, and each substrate unit is attached by a corresponding artificial microstructure.

The artificial electromagnetic material further includes a number of substrates stacked to each other, and the artificial microstructures are positioned between the two adjacent stacked substrates.

One side of the substrate unit is less than one tenth of the wavelength of the incident electromagnetic wave.

The total length of the artificial microstructures is equal to and exceeds one half of the length of the substrate units, and the total width of the artificial microstructures is equal to and exceeds one half of the width of the substrate units.

The artificial electromagnetic material responds to the electromagnetic frequency of 7.5 GHz, and the size of each cuboid substrate unit is 4 mm×4 mm×4 mm.

The size of one "I" shaped metal wire structure is 1.5 mm×1.5 mm, the size of the other "I" shaped metal wire structure is 2 mm×2 mm, and the line width is 0.1 mm.

The artificial electromagnetic material of the present invention has the following beneficial effects: the artificial microstructures of the present invention enable the artificial electromagnetic material to have high resonance frequency, and have wide effective frequency band and applicable range.

In addition, the artificial electromagnetic material of the present invention also has lower permittivity, and has the following beneficial effects: the permittivity of the artificial electromagnetic materail can be gradually increaed from zero in a certain frequency band. Thus, in a certain frequency band, the artificial electromagnetic material has a less permittivity and can be applied to specific fields.

Other advantages and novel features of the present disclosure will become more apparent from the following detailed description of preferred embodiment when taken in conjunction with the accompanying drawings.

DETAILED DESCRIPTION OF ILLUSTRATED EMBODIMENTS

Figure 1:
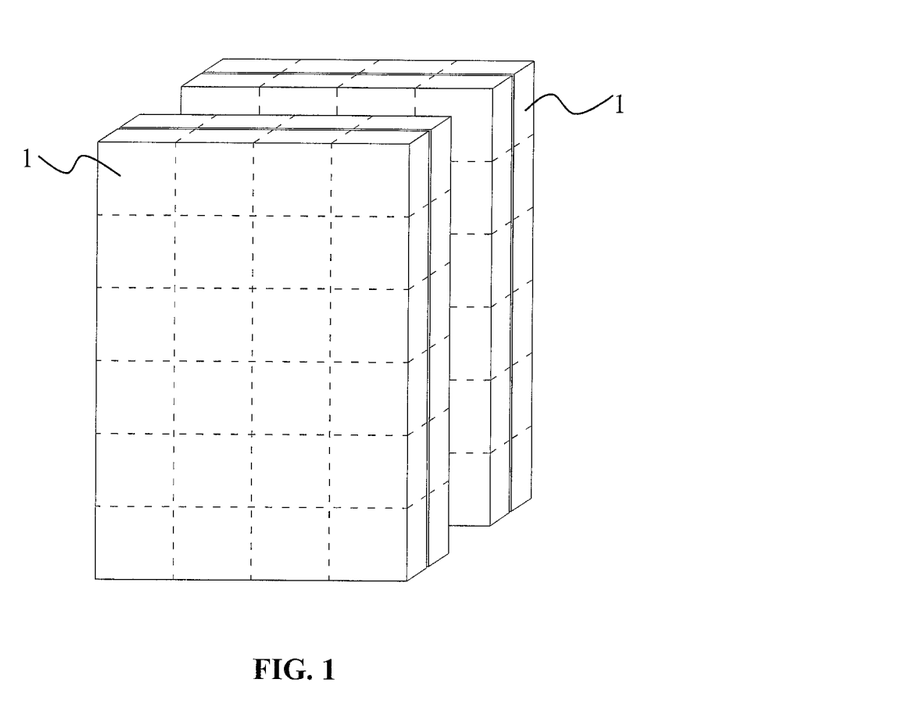
FIG. 1 is a structural schematic view of an artificial electromagnetic material according to a first embodiment of this disclosure.

Referring to FIG. 1, the present invention relates to an artificial electromagnetic material which includes at least one material layer 1. When the artificial electromagnetic material includes more than one material layer 1, all the material layer 1 are stacked together along a direction of perpendicular to the plane of the material layer 1, and are assembled together as an integral whole by means of, but not limited to, mechanical connections, welding, or adhesion. The two adjacent material layers 1 are separated by air, foam or other medium, and the spacing distance betweem the two adjacent material layers 1 can be less than the thickness of the material layer 1, and can also be greater than a few times or ten times or more of the thickness of the material layer 1.

Figure 2:
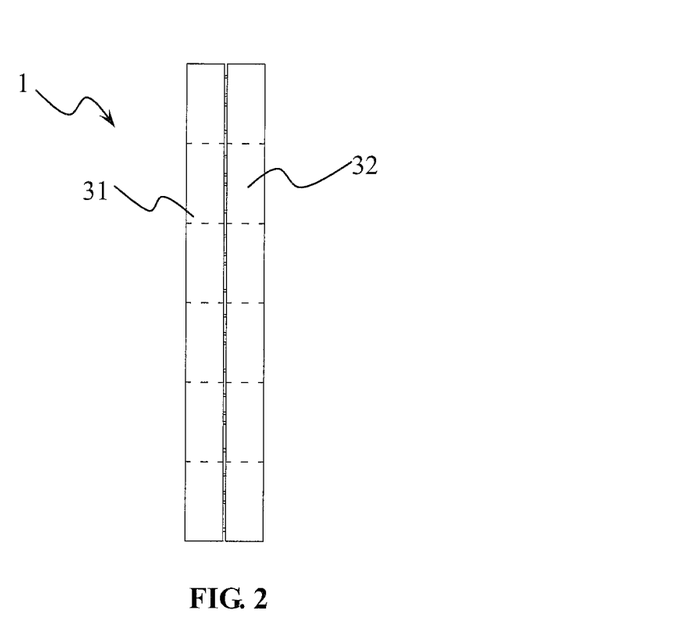
FIG. 2 is a side schematic view of a material layer of the artificial electromagnetic material shown in FIG. 1.
Figure 3:
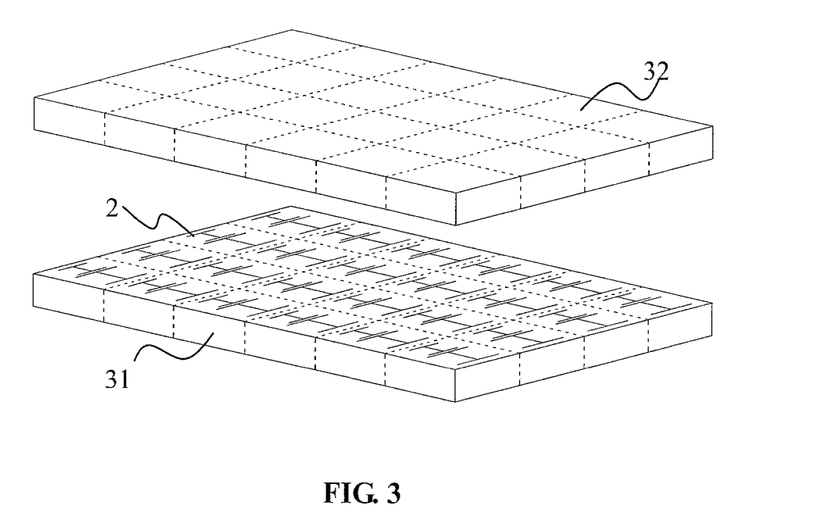
FIG. 3 is an exploded view of the material layer shown in FIG. 2.

Each material layer 1 can be a single substrate, one side of which is attached by a plurality of artificial microstructures. Referring to FIGS. 2 and 3, each material layer 1 can also include two identical plate-shaped substrates with the same thickness, respectively named such as a first substrate 31 and a second substrate 32. The first substrate 31 and the second substrate 32 are superimposed in opposite directions, and the artificial microstructures 2 are positioned between the first substrate 31 and the second substrate 32. In this embodiment, the artificial microstructures 2 are attached to the surface of the first substrate 31 towards the second substrate 32 in an array arrangement. The surfaces of the substrates means the two parallel surfaces with the largest area of all the outer surfaces of the substrate, and the direction perpendicular to the parallel surfaces is defined as a thickness direction of the substrate and the entire artificial electromagnetic material. The length along the thickness direction of the substrate is the thickness of the substrate, and the peripheral sidewalls that are parallel to the direction of the thickness and connected to each other are the side edges of the substrate. The substrate is usually made from FR-4 materials, ceramic, PTFE or other materials.

The two substrates are virtually divided into a plurality of identical square-shaped grids by a group of first surfaces and a group of second surfaces. A plurality of first surface in the group of first surfaces are equally spaced and parallel to each other, and the group of second surfaces includes a plurality of second surfaces equally spaced and parallel to each other and perpendicular to the first surfaces. The first surfaces and the second surfaces are perpendicular to each other and are perpendicular to the surface of the substrates.

Figure 4:
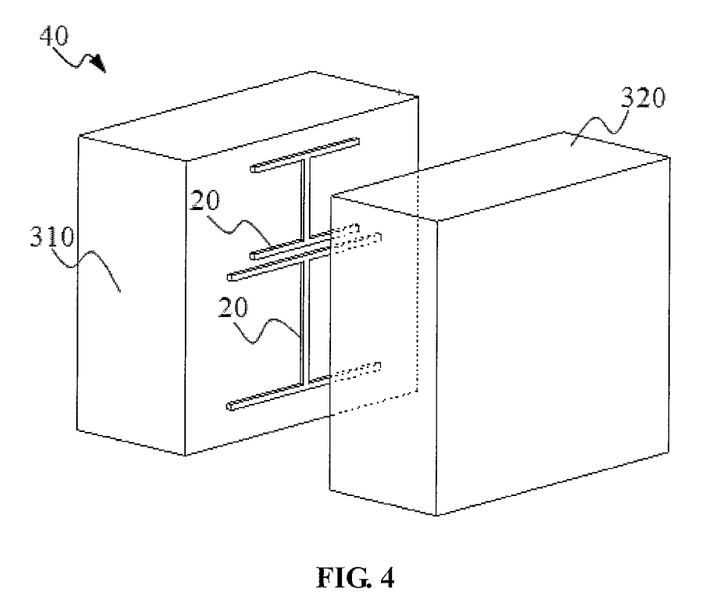
FIG. 4 is an exploded view of a material unit of the material layer in FIG. 2.

Each grid of the first substrate 31 is defined as a first substrate unit 310, and each gird of the second substrate 32 is defined as a second substrate unit 320. One surface of each first substrate unit 310 is attached by a corresponding artificial microstructure. The first substrate unit 310 and the second substrate unit 320 are opposite to each other and form a substrate unit cooperatively. Each substrate unit and the artificial microstructures of the first substrate unit 310 constitute a material unit 40 as shown in FIG. 4. The entire material layer 1 can be considered as an array arrangement of the material units 40 along a direction as the row, and the other direction as the column that is perpendicular to the direction of the row.

The artificial electromagnetic material is applied to a specific electromagnetic field environment, and the wavelength of the electromagnetic wave in the electromagnetic field is pre-known or preset. Preferably, the length, width and thickness of each square material unit 40 in this present embodiment are equal to or less than one tenth of the wavelength of the electromagnetic wave, or can be not greater than one fifth of the wavelength of the electromagnetic wave.

Referring to FIG, 4, each material unit 40 includes a first substrate unit 310, a plurality of artificial microstructures attached to the first substrate unit 310, and a second substrate unit 320. The artificial microstructures are composed of metal wires and have a certain geometric shape or topological shape formed by the metal wires. The metal wires may be made from, but not limited to, silver, copper or other nonferrous metals.

Since the artificial microstructures are attached on one surface of the first substrate unit 310, and the artificial microstructures composed of the metal wires have a certain thickness due to the thickness of the metal wires. Thus, the thickness of each material unit 40 (i.e., the thickness of the material layer 1) is equal to the total thickness of the first substrate 31, the second substrate 32 and the metal wires.

However, because the artificial microstructures are very thin, the artificial microstructures may not be directly attached to the second substrate 32 due to the errors in the process of manufacturing, processing and assembly, but resulting in a clearance between the artificial microstructures and the second substrate 32. The clearance is tolerant in a certain dimension ranges.

The thickness of the artificial microstructure usually falls within a range between 0.005 millimeters (mm)-0.05 mm, preferably 0.018 mm in this embodiment. The spacing distance between the first substrate 31 and the second substrate 32 is within a range being between 0.005 mm-0.5 mm, preferably less than 0.1 mm.

In this embodiment, because the first substrate 31 and the second substrate 32 in any material layer 1 are clamped together, the artificial microstructures contact or basically contact the first substrate 31 and the second substrate 32. Thus, when the artificial microstructures produce response on the electromagnetic wave, the response on the electromagnetic wave can simultaneously act on the first substrate 31 and the secodn substrate 32, making the equivalent permittivity of the material layer 1 to exceed the inherent permittivity of the first substrate 31 and the second substrate 32.

In addition, the other feature of the present invention is: the typical artificial electromagnetic material is usually a "I" shaped metal wire structure which includes two linear parallel lines parallel to each other and a vertical line; the vertical line is perpendicularly connected to the midpoints of the parallel lines.

In the artificial electromagnetic material of the present invention, each artificial microstructure includes two "I" shaped metal wire structures, both of which have different sizes and are mutually separated. In order to enable the two "I" shaped metal wire structures to generate and act the same or similar response on the electromagnetic field and form a superposition of the response effect rather than an offset of the response effect. Thus, the two "I" shaped metal wire structures of each artificial microstructure are preferably placed in parallel arrangement, that is, the two pairs of parallel lines of the two "I" shaped metal wire structures are parallel to each other, and the two vertical lines of the two "I" shaped metal wire structures are parallel to each other.

Referring to FIG. 4, in this embodiment, the vertical lines of the two "I" shaped metal wire structures are in the same line, that makes the two "I" shaped metal wire structures to be preferably positioned up and down.

The refractive index of each material unit 40 has a relationship with the proportion of the occupied surface of the artificial microstructures on the first substrate 310 to the entire surface of the first substrate 310. Therefore, the total length and width of the artificial microstructures should be as large as possible, preferably be equal to or exceeds one half of the length and width of the first substrate 310. Wherein the total length of the artificial microstructures is the distance of the parallel lines formed by the uppermost line to the nethermost line, and the total width of the artificial microstructures is the longest wire length in the four parallel lines between the two "I" shaped metal wire structures.

For example, if the working environment of the artificial electromagnetic material is the electromagnetic waves of 7.5 GHz, the design size of each cuboid substrate unit is about 4 mm×4 mm×4 mm, the sizes of the two "I" shaped metal wire structures are respectively about 1.5 mm×1.5 mm and 2 mm×2 mm, the width of the wire is about 0.1 mm, and the total length and the total width of the artificial microstructures are respectively 3.8 mm and 2 mm.

The artificial electromagnetic materials of the artificial microstructures are simulated by using the CST simulation software, and the simulation results show that in the frequency band range of 2 Ghz-15 GHz (i.e., the bandwidth is 13 GHz), the loss of the refractive index is very small with the increase of the frequency, which provides advantageous conditions to achieve ultra-width band effect. Compared with the present artificial microstructures, the existing artificial microstructure only includes one "I" shaped metal wire structure, whose bandwidth is difficult to achieve the described ultra-width band effects.

Figure 5:
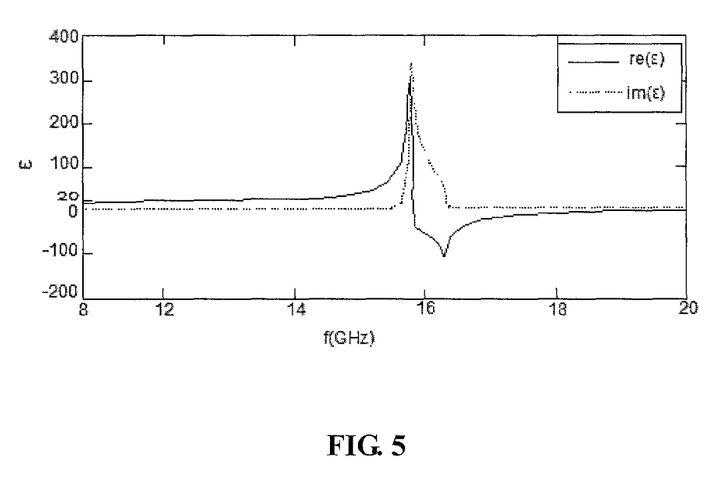
FIG. 5 is a characteristic curve responding to the permittivity of a common material.

FIG. 5 is a characteristic curve responding to the permittivity of a common material. As shown in FIG. 5, the permittivity is usually greater than 10 in the case of low loss.

Figure 6:
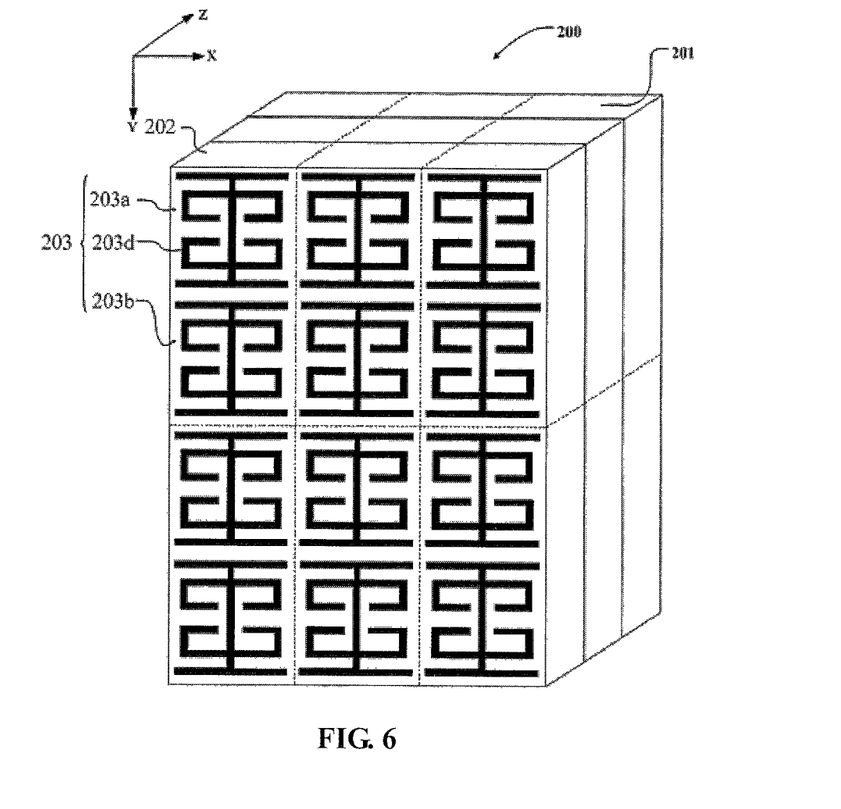
FIG. 6 is a structural schematic view of an artificial electromagnetic material according to a second embodiment of this disclosure.
Figure 7:
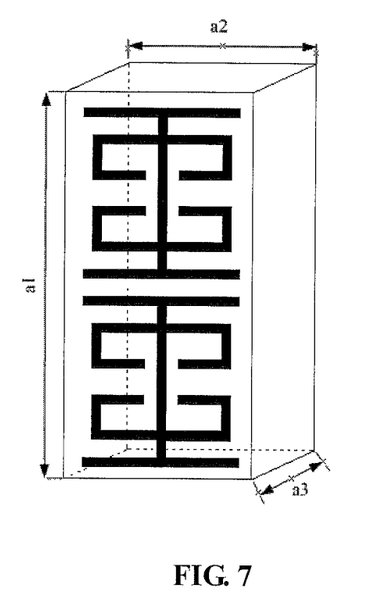
FIG. 7 is a structural schematic view of a material unit of the artificial electromagnetic material shown in FIG. 6.

Also referring to FIGS. 6 and 7, the present invention discloses an artificial electromagnetic material 200 according to a second embodiment. The artificial electromagnetic material 200 includes three material layers 201 with the same thickness. The three material layers 201 are stacked together in turn along the direction perpendicular to the substrate (i.e., the direction of Z axis), and any two adjacent material layers 201 are connected as a whole by means of, but not limited to, welding, riveting, adhesive or other packaging processes, or by filling up with such as liquid substrate materials therebetween. Thus, when the liquid substrate materials are solidified, the adjacent material layers 201 are connected together, so that the multiple material layers 201 are further fixed together to form an integral whole.

Each material layer 201 includes a substrate and a plurality of artificial microstructures 203 attached to the substrate, and the substrate is virtually divided into a plurality of identical cuboid substrate units close adjacent to each other. The substrate units are placed in an array arrangement along the X-direction as the row, the Y-direction as the column perpendicular to the X-direction. The size of each substrate unit is designed as 4 mm×2 mm×0.818 mm, that is, a1=4 mm, a2=2 mm, a3=0.818 mm. The artificial microstructures 203 are attached to each substrate unit in parallel. The substrate units and the artificial microstructures 203 on the substrate units cooperatively constitute a material unit 202 as shown in FIG. 6. The artificial electromagnetic material in this embodiment can be formed by a plurality of material units 20 along X-direction as the row, the Y-direction as the column, and the Z direction as the stack. The artificial microstructures 203 can be attached to the substrate by means of, but not limited to, etching, plating, drilling, photolithography, electronic engraving or ion etching.

The artificial microstructures 203 of the second embodiment is similar to the artificial microstructures 2 of the first embodiment, except for the following features: each artificial microstructure 203 includes a first sub-structure 203a and a second sub-structure 203b, each of the first sub-structure 203a and the second substrate 203b includes a "I" shaped metal wire structure of the first embodiment and two opening rings 203d. The two opening rings 203d are connected to the vertical line of the "I" shaped metal wire structure. Each opening ring 203d defines an opening, and the opening of one opening ring 203d faces towards the opening of the other opening ring 203d.

Figure 8:
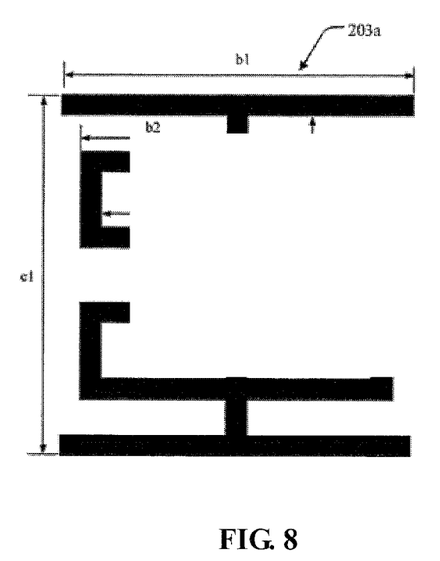
FIG. 8 is a structural schematic view of a first sub-structure of the artificial electromagnetic material shown in FIG. 6.
Figure 9:
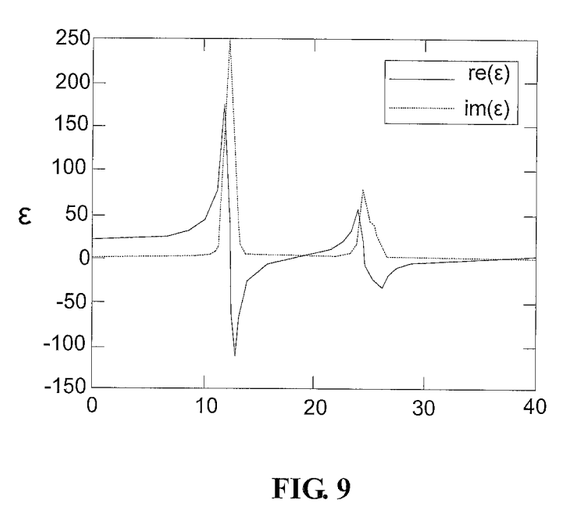
FIG. 9 is a characteristic curve responding to the permittivity of the artificial electromagnetic material of the artificial microstructures shown in FIG. 8.

The artificial microstructures 203 are made by copper wires; the cross-section of each copper wire is a rectangle. The size of the cross-section is about 0.1 mm×0.018 mm, that is, the width of the copper wire is about 0.1 mm, and the thickness of the copper wire is about 0.018 mm. The artificial microstructures 203 can also be made by silver wires or other metal wires, and the cross-section of the metal wire can also be circle, flat shape or other shapes. In this embodiment, the first sub-structure 203a and the second sub-structure 203b have the substantially same size and shape, and the distance from each of the upper side, the left side and the right side of the artificial microstructure 203 to the boundary of the attached substrate is about 0.1 mm. Referring to FIG. 8, the sizes of each part of the first sub-structure 203a are: b1=1.8 mm, b2=0.75 mm, b3=0.5 mm, b4=0.15 mm, c1=1.9 mm, c2=0.2 mm, c3=0.3 mm and c4=0.3 mm. FIG. 9 illustrates a simulation view of permittivity when the electromagnetic waves pass through the artificial electromagnetic material. As shown in FIG. 9, the permittivity characteristic of the artificial electromagnetic material has double resonance. Corresponding to the second resonance, the permittivity is gradually increased from zero during a certain frequency band (18 GHz-22 GHz), as shown by the dotted line, the imaginary part of the permittivity is close to zero in the lower frequency band, so the loss is also lower. Thus, the artificial electromagnetic material can be applied to the situation with small permittivity.

In other embodiment, by changing the size of the material unit or the size of the first sub-structure 203a or the second substrate 203b, the smaller permittivity can be obtained in other frequency bands. The size of the material unit or the size of the first sub-structure 203a or the second substrate 203b is reduced, the resonance peak is shifted backward; the size of the material unit or the size of the first sub-structure 203a or the second substrate 203b is enlarged, the resonance peak is shifted forward.

Figure 10:
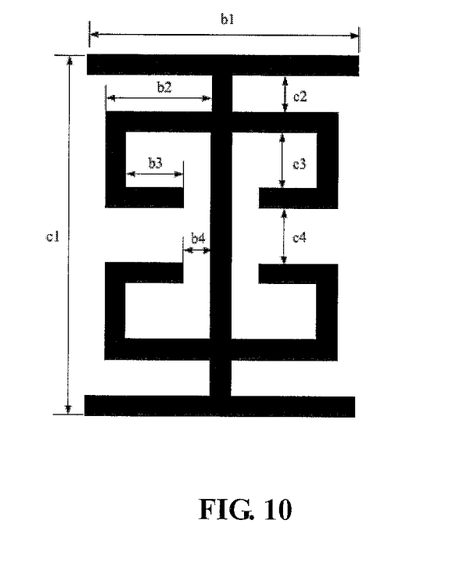
FIG. 10 is a structural schematic view of a first sub-structure according to a third embodiment of this disclosure.
Figure 11:
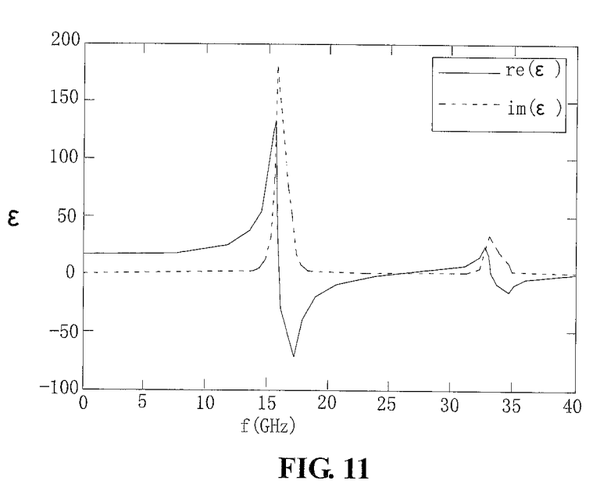
FIG. 11 is a characteristic curve responding to the permittivity of the artificial electromagnetic material of the artificial microstructures shown in FIG. 10.

Referring to FIGS. 10 and 11, the artificial microstructures of the third embodiment is similar to the artificial microstructures of the second embodiment, except for the following features: the widths of the two sub-structures of the artificial microstructures get smaller. The sizes of each part of the first sub-structure 303a as shown in FIG. 10 are: b1=1.2 mm, b2=0.45 mm, b3=0.2 mm, b4=0.15 mm; c1=1.9 mm, c2=0.2 mm, c3=0.3 mm and c4=0.3 mm. The second sub-structure has the substantially same structure and size as the structure and size of the first sub-structure, and the size of the substrate units remain unchanged. FIG. 11 illustrates a simulation view of permittivity when the electromagnetic waves pass through the artificial electromagnetic material. As shown in FIG. 11, the permittivity characteristic of the artificial electromagnetic material has double resonance. Corresponding to the second resonance, the permittivity is gradually increased from zero during a certain frequency band (27 GHz-32 GHz), as shown by the dotted line, the imaginary parts of the permittivity are close to zero in the lower frequency band, so that the loss is also lower. Therefore, the artificial electromagnetic material can be applied to the situation with smaller permittivity. Compared to the second embodiment, when the size of the material unit or the size of the first sub-structure 203a or the second substrate 203b is reduced, the resonance peak is shifted backward; when the size of the material unit or the size of the first sub-structure 203a or the second substrate 203b is enlarged, the resonance peak is shifted forward. The first sub-structure and the second sub-structure have the same size in the described embodiment. It should be noted that even through the first sub-structure and the second sub-structure have the different size, they also have the same characteristics. That is, when the size of the artificial microstructures is changed, for example, if the size of the first sub-structure 203a or the second substrate 203b is enlarged, the resonance peak is shifted backward; if the size of the first sub-structure 203a or the second substrate 203b is reduced, the resonance peak is shifted forward.

Figure 12:
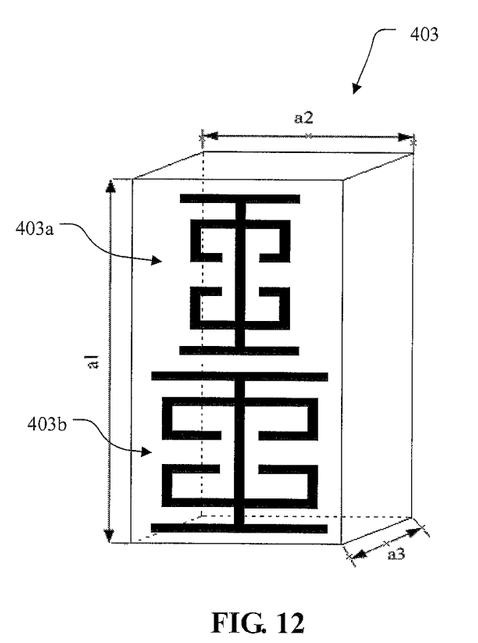
FIG. 12 is a structural schematic view of a material unit according to a fourth embodiment of this disclosure.
Figure 13:
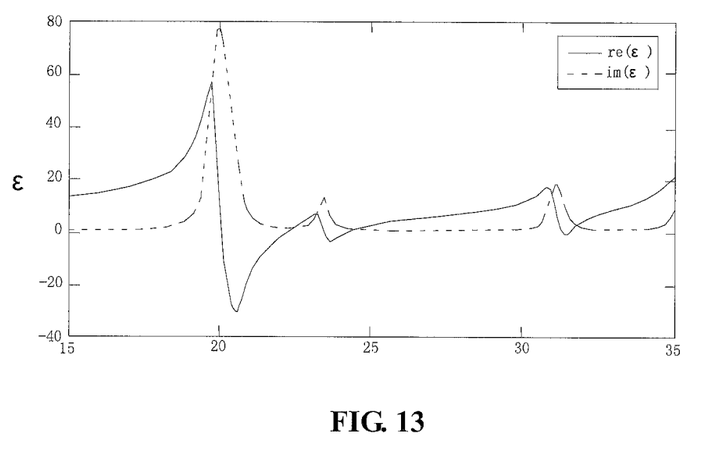
FIG. 13 is a characteristic curve responding to the permittivity of the artificial electromagnetic material of the artificial microstructures shown in FIG. 12.

Referring to FIGS. 12 and 13, the artificial microstructures of the fourth embodiment is similar to the artificial microstructures of the second embodiment, except for the following features: the sizes of the first sub-structure get smaller; the sizes of the second sub-structure remain unchanged. The sizes of the first sub-structure structure 403a as shown in FIG. 8 are: b1=1.2 mm, b2=0.45 mm, b3=0.2 mm, b4=0.15 mm, c1=1.9 mm, c2=0.2 mm, c3=0.3 mm and c4=0.3 mm. As shown in FIG. 13, the permittivity characteristic of the artificial electromagnetic material has multiple resonances. The permittivity is gradually increased from zero during a certain frequency band (24 GHz-30 GHz), as shown by the dotted line, the imaginary parts of the permittivity are close to zero in the lower frequency band, so that the loss is also lower. Thus, the artificial electromagnetic material can be applied to the situation with smaller permittivity. Compared to the first embodiment, when the size of the first sub-structure 403a or the second substrate 403b is reduced, the resonance peak is shifted backward; when the size of the material unit or the size of the first sub-structure 403a or the second substrate 403b is enlarged, the resonance peak is shifted forward. Thus, by changing the sizes of the artificial microstructures, the artificial electromagnetic material with lower permittivity can be applied to different frequency bands.

By using the artificial electromagnetic material of the second embodiment, the third embodiment and the fourth embodiment, the artificial electromagnetic material can obtain the capacity of low permittivity, and the permittivity of the artificial electromagnetic material is gradually increased from zero in a certain band. Thus, the artificial electromagnetic material can meet the specific applications based on the lower permittivity in a certain frequency band.

Although the present disclosure has been specifically described on the basis of the exemplary embodiment thereof, the disclosure is not to be construed as being limited thereto. Various changes or modifications may be made to the embodiment without departing from the scope or spirit of the disclosure.

What is claimed is:

1. An artificial microstructure, comprising two "I" shaped metal wire structures, wherein the two "I" shaped metal wire structures are separated from one another and each of the "I" shaped metal wire structure having a different size, and vertical lines of the two "I" shaped metal wire structures are connected to two opening rings, and the opening of one opening ring faces towards that of the other opening ring, the opening rings of each "I" shaped metal wire are further characterized as having different sizes from one another.

2. The artificial microstructure of claim 1, wherein the two "I" shaped metal wire structures of each artificial microstructure are placed in parallel arrangement, the two pairs of parallel lines of the two "I" shaped metal wire structures are parallel to each other, and the two vertical lines of the two "I" shaped metal wire structures are parallel to each other.

3. The artificial microstructure of claim 2, wherein the vertical lines of the two "I" shaped metal wire structures are in the same line, that makes the two "I" shaped metal wire structures to be preferably positioned up and down.

4. The artificial microstructure of claim 3, wherein each of the opening ring is a rectangular opening structure.

5. The artificial microstructure of claim 1, wherein the artificial microstructures are made by copper wires.

6. The artificial microstructure of claim 1, wherein the artificial microstructures are made by silver wires.

7. The artificial microstructure of claim 1, wherein the cross-section of the metal wire is any of a rectangle, circle, and flat shape.

8. The artificial microstructure of claim 1, wherein the size of each artificial microstructure is less than one tenth of a wave length of incident electromagnetic wave.

9. An artificial electromagnetic material, comprising:
a substrate; and
a plurality of artificial microstructures, wherein the artificial microstructures are attached on the substrate, each artificial microstructure comprises two "I" shaped metal wire structures, and the two "I" shaped metal wire structures are separated from one another and each of the "I"

shaped metal wire structures having a different size, and vertical lines of the two "I" shaped metal wire structures are connected to two opening rings, and the opening of one opening ring faces towards that of the other opening ring, the opening rings of the two "I" shaped metal wire structures having different sizes from one another.

10. The artificial electromagnetic material of claim 9, wherein the artificial microstructures are placed on the substrate in an array arrangement.

11. The artificial electromagnetic material of claim 9, wherein the substrate is divided into multiple identical cuboid substrate units close to each other, and each substrate unit is attached by a corresponding artificial microstructure.

12. The artificial electromagnetic material of claim 9, further comprising a plurality of substrates stacked to each other, and the artificial microstructures being positioned between the two adjacent stacked substrates.

13. The artificial electromagnetic material of claim 11, wherein one side of the substrate unit is less than one tenth of the wavelength of incident electromagnetic wave.

14. The artificial electromagnetic material of claim 13, wherein the total length of the artificial microstructures equals or exceeds one half of the length of the substrate units, and the total width of the artificial microstructures is equal to and exceeds one half of the width of the substrate units.

15. The artificial electromagnetic material of claim 14, wherein the artificial electromagnetic material responds to the electromagnetic wave frequency of 7.5 GHz, and the size of each cuboid substrate unit is 4 mm×4 mm×4 mm.

16. The artificial electromagnetic material of claim 15, wherein the size of one "I" shaped metal wire structure is 1.5 mm×1.5 mm, the size of the other "I" shaped metal wire structure is 2 mm×2 mm, and the line width is 0.1 mm.

17. The artificial electromagnetic material of claim 9, wherein the two "I" shaped metal wire structures of each artificial microstructure are placed in parallel arrangement, the two pairs of parallel lines of the two "I" shaped metal wire structures are parallel to each other, and the two vertical lines of the two "I" shaped metal wire structure are parallel to each other.

18. The artificial electromagnetic material of claim 17, wherein the vertical lines of the two "I" shaped metal wire structures are positioned un and down and in the same line.

19. The artificial electromagnetic material of claim 18, wherein the opening ring is a rectangular opening structure.

20. The artificial electromagnetic material of claim 9, wherein the artificial microstructures are made by copper wires or silver wires.

21. The artificial electromagnetic material of claim 9, wherein the size of each artificial microstructure is less than one tenth of the wave length of incident electromagnetic wave.

* * * * *